United States Patent

[11] 3,602,823

[72] Inventor George William Carter Indianapolis, Ind.
[21] Appl. No. 829,335
[22] Filed June 2, 1969
[45] Patented Aug. 31, 1971
[73] Assignee RCA Corporation

[54] ELECTRONIC SWITCHING OF TUNED CIRCUITS

21 Claims, 1 Drawing Fig.

[52] U.S. Cl. .......... 325/465, 307/259, 325/390, 325/461, 333/11
[51] Int. Cl. .......... H03j 5/14
[50] Field of Search .......... 307/256, 259; 325/461, 464, 465, 390; 331/.179; 333/7; 334/7, 8, 11, 15

[56] References Cited

UNITED STATES PATENTS

| | | | |
|---|---|---|---|
| 3,003,060 | 10/1961 | Lewis, Jr. | 325/461 |
| 3,046,415 | 7/1962 | Winslow | 307/259 |
| 3,230,397 | 1/1966 | Linder | 307/259 |
| 3,264,566 | 8/1966 | Kaufman et al. | 325/465 |

*Primary Examiner*—Benedict V. Safourek
*Attorney*—Eugene M. Whitacre

ABSTRACT: A television tuner includes tunable resonant circuits having a plurality of inductors and a plurality of diode switches for selectively connecting different ones of the inductors in the resonant circuit. A forward biasing voltage is applied to a selected one of the diodes to switch that diode to a low resistance condition and cause the tuner to select a desired television channel. A source of voltage provides a reverse bias supply for the diodes and, additionally, may be utilized as a source of operating potential for the active devices of the tuner.

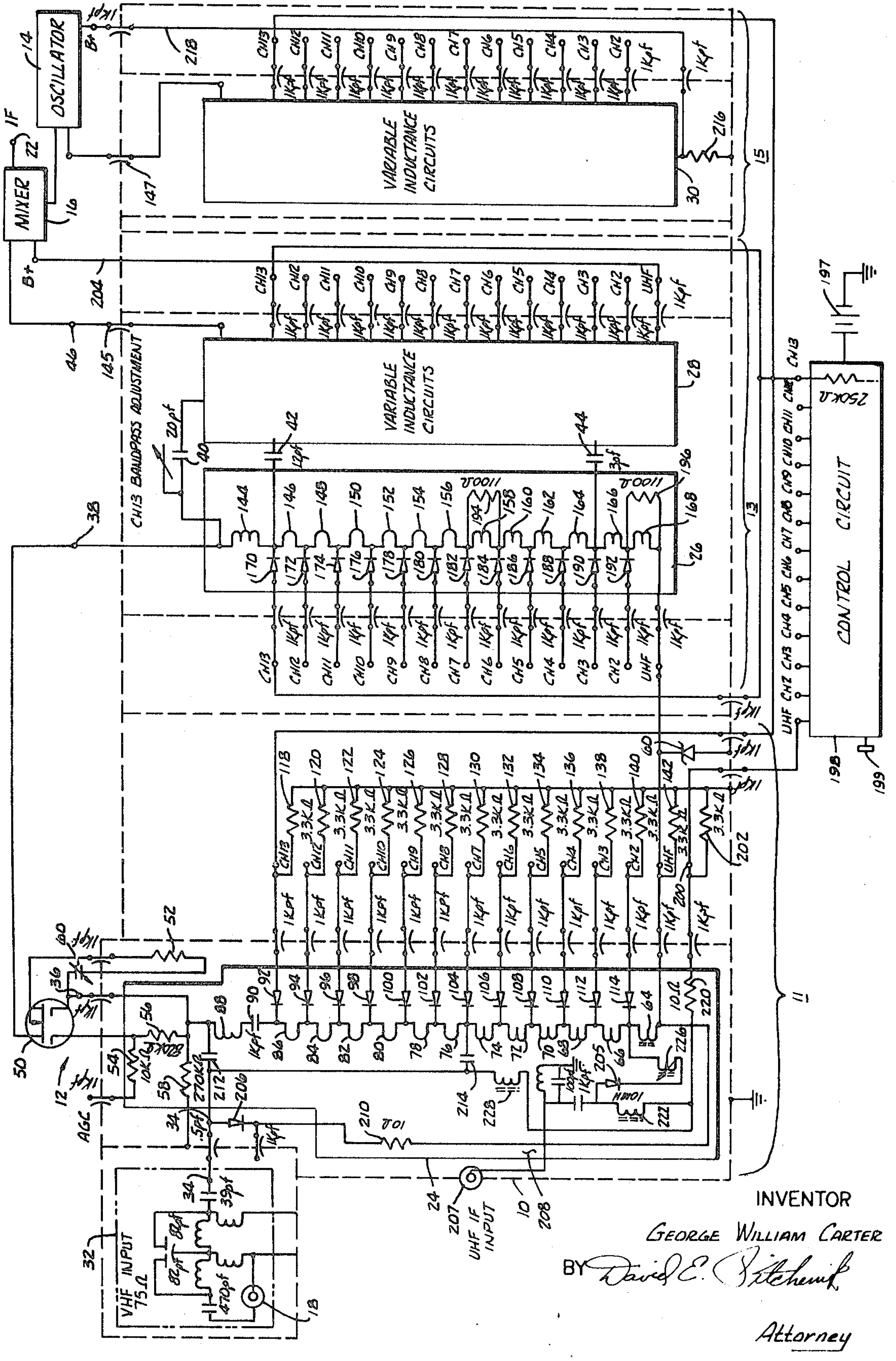
INVENTOR
GEORGE WILLIAM CARTER
BY David E. Fitchenik
Attorney

ELECTRONIC SWITCHING OF TUNED CIRCUITS

The present invention pertains to tunable resonant circuits, and more particularly, to the diode switching of tuned circuits of a television tuner for channel selection.

The use of diodes as radio frequency (RF) switches for television tuned circuits is known, as for example, the diode switched tuner shown in the patent granted to W. M. Kaufman, et al., U.S. Pat. No. 3,264,566.

Semiconductor RF diode switches are devices which typically exhibit a low resistance, shunted by a large capacity, when forward biased and a very high resistance, shunted by a small capacity when back biased. In RF applications, when the diode switch is open (exhibiting high resistance), it is extremely desirable to provide a reverse bias to minimize the shunt capacity. If no reverse bias is applied to the diode, and the diode is allowed to "float," that is, have zero bias applied across the diode junction, the shunt capacity may be relatively high. An RF diode which is "floating" may exhibit a varying, and thus, indeterminate shunt capacity in the order of 2 to 10 picofarads. To overcome this problem, prior art diode switched tuning systems have provided two power supplies, a forward bias supply and a reverse bias supply.

In a tuner for tuning to one of a number of discrete fixed frequencies and having a plurality of tuned circuits, a circuit embodying the present invention includes a plurality of series connected inductors connected for cooperation with a capacitive means. A plurality of diodes, acting as selectively actuatable switches and having like electrodes, are connected to points between the inductors. A plurality of impedance means return the other electrodes of the plurality of diodes to a point of reference potential. Means selectively connect a source of bias potential between the other electrode of one of the plurality of diodes and the point of reference potential for forward biasing the selected one diode. An impedance means is connected between the series connected inductors and the point of reference potential, the voltage developed across the impedance means reverse biases the other ones of the plurality of diodes.

In accordance with a feature of the invention a heterodyne receiver system includes three tunable resonant circuits, one coupled to the RF amplifier stage, one coupled to the mixer stage and one coupled to the oscillator stage. The three circuits include a number of corresponding terminals each of which when energized will cause each tunable resonant circuit to be tuned to a particular frequency. The RF amplifier and mixer tunable resonant circuits, however, each have at least one additional corresponding terminal. The additional terminals when energized will cause the amplifier and the mixer tunable resonant circuits to tune to particular frequencies. Means interconnect each of the corresponding terminals associated with the three tunable circuits. A second means is coupled to the oscillator tunable resonant circuit to establish a voltage when any one of the oscillator terminals is energized, and a third means couples the second voltage establishing means and the oscillator stage to provide operating potential for the oscillator stage.

A complete understanding of the present invention may be obtained from the following detailed description of a specific embodiment thereof, when taken in conjunction with the accompanying drawing, in which:

The single FIGURE is a schematic circuit diagram, partly in block form of a diode switched television tuner embodying the present invention.

Reference is now made to the single FIGURE. A television tuner is enclosed in a compartmented metal housing or enclosure 10 which is connected to or establishes a point of reference potential, shown as ground. The tuner includes an RF amplifier stage 12, an oscillator stage 14, and a mixer stage 16. Part of the circuitry of each stage is enclosed in its respective metal compartment 11, 13 and 15 to prevent an undesired interaction between the stages. VHF television signals are intercepted by an antenna, now shown, and applied to a VHF input terminal 18. The input signals are amplified in the amplifier stage 12 and heterodyned in the mixer stage 16 with locally generated signals from the oscillator stage 14 to produce an intermediate frequency signal output at the terminal 22.

The tuner includes four switched inductance tuning circuits 24, 26, 28 and 30. The switched inductance circuit 24 is associated with the RF amplifier input circuitry, while the switched inductance circuits 26 and 28 are part of a double tuned interstage network between the RF amplifier and the mixer stage 16. The switched inductance circuit 30 is used to establish the frequency of oscillation of the oscillator stage 14. The detailed circuitry is schematically shown for the switched inductance circuits 24 and 26. It should be understood that the switched inductance circuit 28 is similar to the circuits 24 and 26, and the circuit 30 is also similar, with suitable adjustments made for the different frequency and loading requirements Each of the switched inductance circuits 24, 26, 28 and 30 selectively provide different inductive reactances which in combination with various tuner capacitances form tunable resonant circuits. It should be noted in the present description that several 1,000 picofarad capacitors are not designated by numerals nor described in detail. These capacitors are included in the circuit to provide a low impedance for RF signals.

The received VHF signals applied at the input terminal 18 are coupled through a high pass filter 32 to the RF amplifier input circuit which includes the switched inductance circuit 24. The amplified VHF signals developed at the output electrode of the RF amplifier stage 12 are applied to a terminal 38 at the high potential side of the switched inductance circuit 26. The switched inductance circuit 26 is coupled to the switched inductance circuit 28 by three capacitors 40, 42 and 44. These capacitors provide uniform coupling between the circuit 26 and the circuit 28 across the tuned frequency band. The signals which are developed across the switched inductance circuit 28 are applied via the terminal 46 to the input terminal of the mixer stage 16. An additional input wave is applied to the mixer stage from the oscillator stage 14 so that the mixer heterodynes the amplified RF signal and the locally generated wave to provide a desired IF output. The remaining switched inductance circuit 30 controls the frequency of operation of the oscillator stage 14.

The RF amplifier stage 12 includes a dual gate insulated gate field effect transistor 50. The resistors 52, 54, 56 and 58 are interconnected with the electrodes of the transistor 50 to provide the proper biasing and AGC voltage. The particular arrangement is described in detail in my pending U.S. Pat. application entitled, "Gain Control Biasing Circuits for Field-effect Transistors," Ser. No. 689,454, filed Dec. 11, 1967, and assigned to the Radio Corporation of America. The switched inductance circuit 24 is connected to the first gate electrode of the transistor 50 and provides an inductive reactance which resonates with the input capacitance of the gate electrode and the capacity provided by a trimmer capacitor 60.

The switched inductance circuit 24 includes a plurality of inductors connected in series between the terminal 36 and the cathode of a 15-volt zener diode 62, the anode of which is connected to the conductive enclosure 10 and, thus, to ground, The inductances connected in series include an RF choke 64 and the inductors 66 through 86. Additionally, an inductor 88 is connected in the string of inductors; however, it is isolated from the other inductors by a DC blocking capacitor 90, a low impedance path for RF signals.

An RF diode switch is connected to a tap connection between each of the several inductors. Thus, the cathodes of the diodes 92 through 114 are coupled respectively to the junctions between the various inductors 64–86. The anodes of each of the diodes are connected to terminals designated UHF and channels 2 through 13. Each terminal is connected to the point of reference potential, shown as ground, by a bypass capacitor (which are not designated by numerals) and a series of resistors 118 through 142. The value of the resistors is not critical and are shown as being 3.3 kilohms.

The switched inductance circuit 26 associated with the output electrode of the tetrode field effect transistor 50 is similar to that of switched inductance circuit 24. The circuit 26 provides an inductive reactance which resonates with the output capacitance of the transistor 50. The switched inductance circuit 26 includes a plurality of inductors 144 through 168 connected in series, and a plurality of diodes 170 through 192 coupled to the junctions between the inductors in the string. The anodes of each of the diodes are connected to terminals which are designated channel 2 through channel 13 and UHF. Each of the several terminals is bypassed to ground for radio frequency signals by a feedthrough capacitor (which are not designated by numerals). Resistors 194 and 196 are connected across the inductors 158 and 168 respectively to provide a shaping of the band-pass characteristics when these resistors are electrically included in the resonant circuit.

A source of operating potential, indicated as a battery 197, is connected to the tuner 10 through one of the terminals designated UHF and channels 2 through 13, of a control circuit 198. The control circuit 198 sequentially couples the operating potential supply to these terminals in response to manual actuation of a control button 199, or in response to suitable remote control actuation. Each terminal includes a series resistor of approximately 250 ohms, connected through electronic switching circuitry, not shown, to the source of operating potential 197. Switching circuitry suitable for use in the control circuits 198 are disclosed in a copending application entitled, "Television Electronic Control Circuit for Channel Selection," filed May 29, 1969, Ser. No. 829,057 in the names of Wayne Wheeler Evans and Jerome Benjamin Bean, Jr., and assigned to the RCA Corporation. Other switching circuitry suitable for use in the control circuit 198 are disclosed in a patent granted to Kaufman et al., U.S. Pat. No. 3,264,566.

The terminals designated channel 2 through channel 13 which are associated with each of the switched inductance circuits 24, 26, 28 and 30 are each connected in parallel to the similarly designated terminal associated with the control circuit 198. To avoid confusion, only the channel 13 terminal associated with the four switched inductance circuits are shown as being connected to the channel 13 terminal of the control circuit. It should be understood that the remaining terminals channel 2 through channel 12 are connected in a similar manner to the corresponding terminals of the control circuit 198.

The terminals which are designated UHF and associated with the switched inductance circuits 24, 26, and 28 are connected in parallel, not to the control circuit 198 as in the case of the other tunable resonant circuit terminals, but to the cathode of the Zener diode 62. The UHF terminal associated with the control circuit 198 is connected to a terminal 200 which is connected to ground by a resistor 202 and a feedthrough capacitor (not designated by a numeral). The operation of the UHF system will be described hereinafter.

The operating potential supply 197 supplies the energizing voltage for the RF amplifier 12, mixer 16 and oscillator 14. In addition, the supply 197 switches desired ones of the diodes to their low impedance conditions and maintains the remaining diodes reversed biased. Since the supply 197 is connected to the terminal 13 as shown in the drawing, the four diodes (only two of which are shown) associated with the channel 13 terminal are forward biased. All of the diodes associated with the other channel terminals are reverse biased since there is insufficient voltage at the other terminal of the control circuit 198. With regard to the switched inductance circuit 24, the voltage developed at the channel 13 terminal is applied across the resistor 118, and additionally, across the anode-cathode of the diode 92, through the inductor string including the inductors 86 through 64, the UHF terminal, and across the cathode-anode junction of the 15-volt Zener diode 62 to the conductive enclosure 10 of the tuner and, hence, to ground, The 15-volt Zener diode establishes a regulated 15-volt point of positive potential at its cathode electrode, relative to ground.

The voltage developed at the cathode electrode of the Zener diode 62 performs several functions. First, it provides a regulated source of operating potential for the RF amplifier stage 12 and the mixer stage 16. The potential to the drain electrode of the tetrode field effect transistor 50 is from the cathode of the Zener diode 62 through the series connected inductors of the switched inductance circuit 26, to the terminal 38, where it is applied to the device. In the case of the mixer circuit 16, the operating voltage is derived from the cathode of the Zener diode 62 via a lead 204.

The voltage established at the cathode of the Zener diode provides a reverse biasing potential for the several diodes coupled to the inductor strings of the switched inductance circuits 24, 26 and 28. The potential at the cathode of the diode 62 is applied via the inductors to the cathode of every switching diode associated with the three inductor strings (the diodes in the switched inductor circuit 28 are not shown). The voltage is applied across the diode and resistor associated therewith. It should be noted, since each of the several terminals designated UHF and channels 2 through 13 associated with each of the tunable switched inductance circuits 24, 26, 28 and 30 are connected in parallel the resistors 118 through 142 which provide a ground connection for all of the corresponding terminals associated with the variable inductance circuits 24, 26, 28 and 30.

The reverse bias applied to the diode switches minimizes the shunt capacity associated with each diode junction. Where the junction of the diode is not reverse biased, the shunt capacitance associated with the diode may range from 2 to 10 picofarads. More serious, however, is the fact that the diode capacitance varies with temperature and the age of the diode. Such variations create a changing reactive condition and will cause the tunable resonant circuit to vary from the desired resonant frequency.

The potential developed at the cathode of the Zener diode 62 further provides a reverse bias for a diode 205 associated with a UHF IF input terminal 207 and a diode 206 associated with the VHF input terminal 18. The diode 205 is connected in series with the output terminal of an IF coupling circuit 208 coupled to the UHF IF input terminal 207, while the diode 206 is connected in shunt with the output terminal of the filter 32 associated with the VHF input terminal 18. Consequently, the reverse bias obtained from the cathode of the Zener diode 62 causes the diode 205 to be reverse biased and to decouple the UHF IF coupling circuit 208 from the switched inductance circuit 24. At the same time, the voltage developed at the cathode of the diode 62 is applied through an RF decoupling resistor 210 to reverse bias the diode 206. Since the diode 206 is connected in shunt with the output of the filter 32, the reverse biasing of the diode 206 permits the VHF input signals applied at the terminal 18 to be developed at the terminal 34.

Consider now the RF signal path when the diode 92 is forward biased as indicated above. The VHF signals applied at the terminal 18 are coupled through the filter 32 and are developed at the terminal 34. The signals developed at the terminal 34 are coupled to the inductor string by the capacitors 212 and 214. However, since the diode 92 is forward biased, providing a very low impedance path for RF signals, the junction of the inductor 86 and capacitor 90 is connected to ground for RF signals through the diode 92 and the feedthrough capacitor associated with the anode of the diode.

The circuit components are apportioned such that with the diode 92 forward biased, the tunable resonant circuit associated with the variable inductance circuit 24 is tuned to the channel 13 frequency, which is at the top of the VHF TV frequency band. The signal amplified by the amplifier stage 12 is applied to the switched inductance circuit 26. Since the switched inductance circuit 26 channel 13 terminal is also energized, causing the diode 170 to be forward biased, the associated tunable resonant circuit is similarly tuned to the channel 13 frequency. At this time, the inductor 144 is connected to ground through the diode 170 and the feedthrough capacitor associated with the anode electrode of the diode.

The switched inductance circuit 26 is coupled through the coupling capacitors 40, 42 and 44 to the switched inductance circuit 28 which is likewise, because of the voltage applied to its channel 13 terminal, tuned to resonate at the channel 13 frequency. In a like manner, the channel 13 terminal of the switched inductance circuit 30 is energized which causes its associated resonant circuits to be tuned to the required frequency to provide the appropriate oscillation frequency, 257 MHz, for heterodyning in the mixer stage 16 with the amplified RF channel 13 signals.

In the case of the switched inductance circuit 30 associated with the oscillator stage 14, the inductor string, which is not shown, is connected to the conductive casing 10 and, hence, to ground by a resistor 216. The resistor 216 in the case of the oscillator switched inductance circuit develops a voltage which reverse biases the switching diodes inasmuch as their cathodes are connected to the inductor string. Consequently, when the control circuit 198 connects the operating potential supply 197 to a selected one of the several terminals associated with the switched inductance circuit 30, the diode connected to that terminal is forward biased and current flows through the diode and the series connected inductors, as was the case with the switched inductance circuit 24, through the resistor 216 to ground. Thus, a voltage is developed across the resistor 216 which causes the remaining diodes associated with the nonselected terminals to be reverse biased. The voltage developed across the resistor 216 is applied to the oscillator stage 14 via a lead 218.

When the UHF terminal associated with the control circuit 198 is selectively connected to the operating supply source 197 by the electronic switching circuitry, the voltage developed at the terminal, as previously indicated, is applied to the terminal 200 and across the resistor 202. The voltage is applied across the series circuit including the RF decoupling resistor 220, an RF choke 222, the diode 205, an RF choke 226, the RF choke 64, and the resistor 142 in parallel with the Zener diode 62 to ground. Additionally, the voltage at the terminal 200 is applied across a second series circuit including resistor 220, an RF choke 228, the diode 206, the resistor 210 and the resistor 142 to ground. Thus, it can be seen that both the diodes 205 and 206 are caused to be forward biased. The forward biasing of the diode 205 causes signals at the UHF IF input terminal 20 to be coupled through the circuit 208 and the diode 205 to the series connected inductor string; specifically, at the junction of the inductor 64 and 66. Moreover, the forward biased diode 206 which is connected in shunt with the output of the filter 32 shorts the filter output and prevents a VHF signal voltage from developing at the terminal 34 which may be coupled into the tunable resonant circuit.

With the terminal 200 energized, the voltage developed across the Zener diode 62 is applied through the series connected inductors in the switched inductance circuits 24, 26 and 28 to the cathodes of the several diodes, causing each of these diodes to be reverse biased. Under these conditions, the switched inductance circuits 24, 26, and 28 are tuned to resonate at the IF of the television receiver. Thus, the RF amplifier stage 12 and the mixer stage 16 provide amplification of the UHF IF signal which is developed in a separate UHF tuner, not shown, but connected to the terminal 207.

It should be noted that the switched inductance circuit 30 associated with the oscillator stage 14 does not have a UHF terminal. Therefore, when the UHF terminal associated with the control circuit 198 is energized, there is no voltage applied to the switched inductor circuit 30 or to the oscillator stage 14. Thus, the oscillator stage is inoperative during UHF reception.

What is claimed is:

1. A tuner for tuning to one of a number of discrete fixed frequencies, said tuner having a plurality of tuned circuits, said circuits comprising capacitive means, a plurality of series connected inductors for cooperation with said capacitive means, and a plurality of diodes acting as selectively actuatable switches and having like electrodes connected to points between said inductors, a plurality of first impedance means for returning the other electrodes of said plurality of diodes to a point of reference potential, a source of bias potential, means for selectively connecting said source of bias potential between said other electrodes of one of said diodes and said point of reference potential, for forward biasing said one diode, second impedance means connected between said series connected inductors and said point of reference potential, the voltage developed across said second impedance means when current flows therethrough reverse biasing other ones of said diodes.

2. A tuned circuit as defined in claim 1 wherein said second impedance means includes a Zener diode.

3. A tuned circuit as defined in claim 1 wherein said second impedance means includes a resistor.

4. A tuned circuit as defined in claim 1 wherein each of said plurality of first impedance means includes a resistor.

5. A tuned circuit as defined in claim 4 wherein each of said plurality of first impedance means includes a capacitor coupled across said resistor.

6. A tuned circuit as defined in claim 5 wherein said second impedance means includes a Zener diode.

7. A tuned circuit as defined in claim 5 wherein said second impedance means includes a resistor.

8. In a tuner for tuning to one of a number of discrete fixed frequencies, said tuner including an RF stage, a local oscillator stage and a mixer stage, a system comprising:
- a first tunable resonant circuit coupled to said RF stage;
- a second tunable resonant circuit coupled to said mixer stage;
- a third tunable resonant circuit coupled to said oscillator stage;
- said first, said second, and said third tunable resonant circuits each including capacitive means, a plurality of corresponding series connected inductors for cooperation with said capacitive means, and a plurality of corresponding diodes acting as selectively actuatable switches and having like electrodes connected to points between said inductors;
- a plurality of first impedance means for returning the other electrodes of said plurality of corresponding diodes to a point of reference potential;
- a source of potential;
- means for selectively connecting said source of potential between said other electrodes of one of said corresponding diodes and said point of reference potential, for forward biasing said selected corresponding diodes; and
- second impedance means connected between said series connected inductors and said point of reference potential, the voltage developed across said second impedance means when current flows therethrough reverse biasing the nonselected corresponding diodes.

9. A system as defined in claim 8 including connecting means for coupling said second impedance means and said tuner such that the voltage developed across said second impedance means provides an operating potential for said tuner.

10. A system as defined in claim 8 wherein said second impedance means includes a first means coupled between said first and said second tunable resonant circuit series connected inductors and said point of reference potential, and a second means coupled between said third tunable resonant circuit series connected inductors and said point of reference potential.

11. A system as defined in claim 10 including first connecting means for coupling said first means and said RF stage and said mixer stage such that the voltage developed across said first means provides an operating potential for said RF stage and said mixer stage, and second connecting means for coupling said second means and said oscillator stage such that the voltage developed across said second means provides an operating potential for said oscillator stage.

12. A system as defined in claim 11 wherein said first means is a Zener diode.

13. A system as defined in claim 11 wherein said second means is a resistor.

14. A system as defined in claim 11 wherein said first means is a Zener diode and said second means is a resistor.

15. A system as defined in claim 14 wherein each of said plurality of first impedance means includes a resistor.

16. A system as defined in claim 15 wherein each of said plurality of first impedance means includes a capacitor coupled across said resistor.

17. In a heterodyne receiver system including an RF amplifier stage, a mixer stage and an oscillator stage, a system comprising:

a first tunable resonant circuit coupled to said RF amplifier stage;

a second tunable resonant circuit coupled to said mixer stage;

a third tunable resonant circuit coupled to said oscillator stage;

said first, second and third tunable resonant circuits each including a series of corresponding terminals which when energized will cause each tunable resonant circuit to be tuned to a particular frequency;

said first and said second turnable resonant circuits each having at least one additional corresponding terminal in excess of said third tunable resonant circuit which when energized will cause each of said first and said second tunable resonant circuits to be tuned to a particular frequency;

first means interconnecting each of said corresponding terminals associated with said first, said second and said third tunable resonant circuits;

second means coupled to said third circuit for establishing a voltage when any one of said third tunable resonant circuit terminals is energized; and third means coupling said second means and said oscillator stage to provide operating potential for said oscillator stage.

18. A system as defined in claim 17 including fourth means coupled to said first and said second tunable resonant circuits for establishing a voltage when any one of said first and said second tunable resonant circuit terminals is energized; and fifth means coupling said fourth voltage establishing means and said RF amplifier stage and said mixer stage to provide operating potential for said amplifier and said mixer stage.

19. In a heterodyne receiver system including an RF stage, a mixer stage and an oscillator stage, a system comprising:

a first tunable resonant circuit coupled to said RF stage;

a second tunable resonant circuit coupled to said mixer stage;

a third tunable resonant circuit coupled to said oscillator stage;

said first, second and third tunable resonant circuits each including a series of corresponding terminals which when energized will cause each tunable resonant circuit to be tuned to a particular frequency;

said first and said second tunable resonant circuits each having at least one additional corresponding terminal in excess of said third tunable resonant circuit which when energized will cause each of said first and said second tunable resonant circuits to be tuned to a particular frequency;

first means interconnecting each of said corresponding terminals associated with said first, said second and said third tunable resonant circuits;

a source of potential;

means for selectively connecting said source of potential to one of said interconnected corresponding terminals;

a Zener diode coupled to said first and said second tunable resonant circuit for establishing a first voltage when current flows therethrough when one of said first and second tunable resonant circuit interconnected terminals is energized;

impedance means coupled to said third tunable resonant circuit for establishing a second voltage when current flows therethrough when one of said third tunable resonant circuit interconnected terminals is energized;

first connecting means for coupling said Zener diode and said RF stage and said mixer stage such that said first voltage provides an operating potential for said RF and mixer stages; and second connecting means for coupling said impedance means and said oscillator stage such that said second voltage provide an operating potential for said oscillator stage.

20. A system as defined in claim 19 wherein said impedance means is a resistor.

21. An electric circuit comprising:

inductor means having a plurality of junctions;

a plurality of diodes acting as selectively actuatable switches and having like electrodes connected to said junctions;

a plurality of first impedance means for returning the other electrodes of said plurality of diodes to a point of reference potential;

a source of bias potential;

means for selectively connecting said source of bias potential between said other electrode of one of said diodes and said point of reference potential for forward biasing said one diode; and second impedance means connected between said inductor means and said point of reference potential, the voltage developed across said impedance means when current flows therethrough reverse biasing other ones of said diodes.